(12) United States Patent  
Yamada (10) Patent No.: US 6,610,988 B1  
(45) Date of Patent: Aug. 26, 2003

(54) CHARGED PARTICLE BEAM DRAWING APPARATUS AND CHARGED PARTICLE BEAM DRAWING METHOD

(75) Inventor: Yasuhisa Yamada, Tokyo (JP)

(73) Assignee: NEC Electronics Corporation (JP)

( * ) Notice: Subject to any disclaimer, the term of this patent is extended or adjusted under 35 U.S.C. 154(b) by 280 days.

(21) Appl. No.: 09/691,581

(22) Filed: Oct. 18, 2000

(30) Foreign Application Priority Data

Oct. 18, 1999 (JP) .......................................... 11-294718

(51) Int. Cl.[7] .......................... H01J 37/08; G21K 5/10; G21G 5/00; A61N 5/00
(52) U.S. Cl. ............................ 250/492.22; 250/396 R; 250/492.1; 250/492.2; 250/492.21; 250/492.23
(58) Field of Search .......................... 250/398, 492.22, 250/491.1, 492.1, 492.2, 492.21, 492.23, 492.3

(56) References Cited

U.S. PATENT DOCUMENTS

| | | | | |
|---|---|---|---|---|
| 4,524,277 A | * | 6/1985 | Shimura et al. | 250/397 |
| 5,438,207 A | * | 8/1995 | Itoh et al. | 250/492.23 |
| 5,633,507 A | * | 5/1997 | Pfeiffer et al. | 250/492.23 |
| 5,831,273 A | * | 11/1998 | Someda et al. | 250/492.22 |
| 5,929,454 A | * | 7/1999 | Muraki et al. | 250/491.1 |
| 6,093,511 A | * | 7/2000 | Tanaka et al. | 430/30 |
| 6,147,355 A | * | 11/2000 | Ando et al. | 250/492.2 |
| 6,455,863 B1 | * | 9/2002 | Babin et al. | 250/492.23 |

FOREIGN PATENT DOCUMENTS

| | | | |
|---|---|---|---|
| JP | 2830854 | 9/1998 | H01L/21/027 |
| JP | 10-321499 | 12/1998 | H01L/21/027 |
| JP | 2888228 | 2/1999 | H01L/21/027 |
| JP | 10-335215 | 12/1999 | H01L/21/027 |

* cited by examiner

Primary Examiner—John R. Lee  
Assistant Examiner—Bernard E. Souw  
(74) Attorney, Agent, or Firm—Hayes Soloway P.C.

(57) ABSTRACT

An electron beam emitted by an electron beam source, is deflected by a first pattern selection deflector and irradiated onto a predetermined aperture on a first mask. The electron beam penetrating through the first mask is deflected by a second pattern selection deflector, irradiates onto a second mask, and further irradiates on a semiconductor wafer provided on a wafer stage, as a result, a partial blank shot is executed. On the second mask, a cell projection exposure aperture to be drawn a center portion pattern of a cell array pattern, is provided and a cell projection exposure aperture for an excess pattern is not provided. On the first mask, a main aperture and an aperture to be irradiated an excess pattern portion having an area of 1/N of the main aperture to the semiconductor wafer, are provided, wherein N is an integer.

8 Claims, 7 Drawing Sheets

Fig. 3A
WHEN DRAWING CENTER PORTION PATTERN

Fig. 3B
WHEN DRAWING EXCESS PATTERN

Fig. 6A
WHEN DRAWING
CENTER PORTION PATTERN

Fig. 6B
WHEN DRAWING
EXCESS PATTERN

Fig. 6B'
WHEN DRAWING
EXCESS PATTERN

Fig. 7

CHARGED PARTICLE BEAM DRAWING APPARATUS AND CHARGED PARTICLE BEAM DRAWING METHOD

BACKGROUND OF THE INVENTION

1. Field of the Invention

The present invention relates to a charged particle beam drawing apparatus for directly drawing a pattern onto a sample wafer using a charged particle beam such as an electron beam, and, in particular, a charged particle beam drawing method for drawing a repeating pattern, such as a cell array pattern, by a partial blank drawing method.

This application is based on Japanese Patent Application No. Hei 11-294718, the contents of which are incorporated herein by reference.

2. Description of Related Art Including Information Disclosed Under 37 CFR 1.97 and 37 CFR 1.98

A blank drawing method is used as an example of an electron beam drawing method for lithography in a process for preparing a capacity contact in a DRAM manufacturing process, or the like. In this method, when the same patterns are sequential, a part of the repeating pattern is provided as a cell projection exposure aperture on the second mask (which is also called "the second aperture"), the electron beam penetrates the first mask (which is also called "the first aperture") on which a rectangular hole is provided, and the electron beam penetrates the second mask having the cell projection exposure aperture. As a result, plural patterns are simultaneously drawn on a sample wafer. That is to say, the blank drawing method is executed so that the electron beam penetrates the cell projection exposure aperture on the second mask, wherein the area of the cell projection exposure aperture of the second mask is the same as an irradiation area of the electron beam which has already penetrated the rectangular hole on the first mask, as a result, the cell projection exposure aperture pattern formed on the second mask is sequentially drawn on the sample wafer. This method particularly reduces drawing time for periodic patterns.

When a repeating pattern is drawn by the partial blank drawing method, in a preparation step of data of the repeating pattern, a repeating pattern is selected from design data as a basic cell for a partial blank drawing and the repeating pattern is output as partially blank direct drawing data. However, a number of the periodic repeating pattern may not agree with an integer multiple of the number of a pattern of the basic cell for the partial blank drawing. Conventionally, to solve this problem, the partial blank drawing method was controlled as follows:

(1) A size of the basic cell for the partial blank drawing is adjusted and selected not so as to generate an excess pattern.

(2) To improve throughput, a pattern group having a maximum size within an area in which the partial blank drawing can be carried out, is selected as the basic cell for the partial blank drawing. On the other hand, the excess pattern, as a fraction which is generated at the end of a cell array pattern and cannot be in the maximum area is drawn using an aperture of a single pattern provided on the second mask or using a variable rectangular drawing method by combining the pattern of the first mask and the pattern of the second mask.

(3) To improve the throughput, a pattern group having a maximum size within an area in which the partial blank drawing can be carried out is selected as a first basic cell for partial blank drawing. On the other hand, the excess pattern as a fraction which is generated at the end of a cell array pattern and cannot be in the maximum area is selected as a second basic cell for partial blank drawing, an aperture for a partial blank drawing for the excess pattern is provided in addition to an aperture for a main partial blank drawing, and a cell array pattern is drawn using plural type apertures for a partial blank drawing.

Figure 5A:
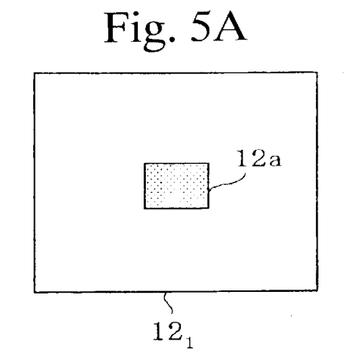
FIGS. 5A to 5C are pattern diagrams of the first and second masks and a cell array pattern diagram according to an embodiment of the conventional art.
Figure 5B:
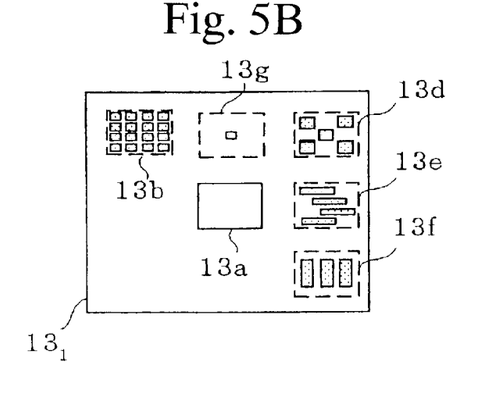
Figure 5C:
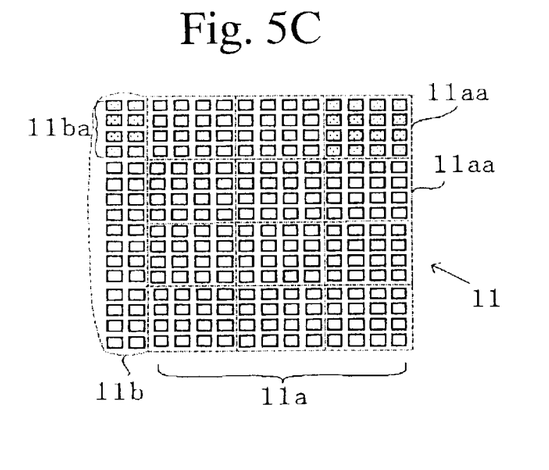

FIG. 5 illustrates the above methods (2) and (3). FIG. 5A shows an aperture pattern of the first mask, FIGS. 5B and 5B' show aperture patterns of the second mask, and FIG. 5C shows a cell array pattern on a semiconductor wafer to be formed by the cell projection exposure.

As shown in FIG. 5A, a rectangular aperture 12a is provided on the center of the first mask $12_1$. As shown in FIG. 5B, a rectangular aperture 13a and cell projection exposure apertures 13a and 13d to 13g are provided on the second mask $13_1$ which is used in the above method (2). Furthermore, a cell projection exposure aperture 13h is provided on the second mask $13_2$ which is used in the above method (3) for the cell projection exposure aperture 13g having a single pattern on the second mask $13_1$, wherein plural patterns corresponding to an excess pattern are formed on the cell projection exposure aperture 13h. As shown in FIG. 5C, a cell array pattern 11 is composed of a center portion pattern 11a drawn using the cell projection exposure aperture 13b as a standard, and an excess pattern 11b without the center portion pattern 11a.

Figure 6A:
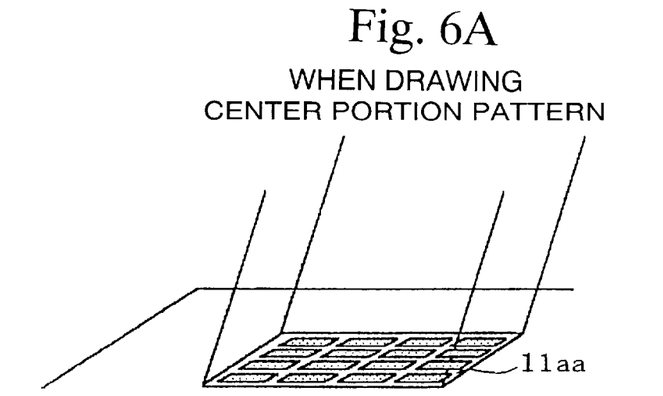
FIGS. 6A to 6B' are schematic diagrams for explaining the state of the drawing according to an embodiment of a conventional art.
Figure 6B:
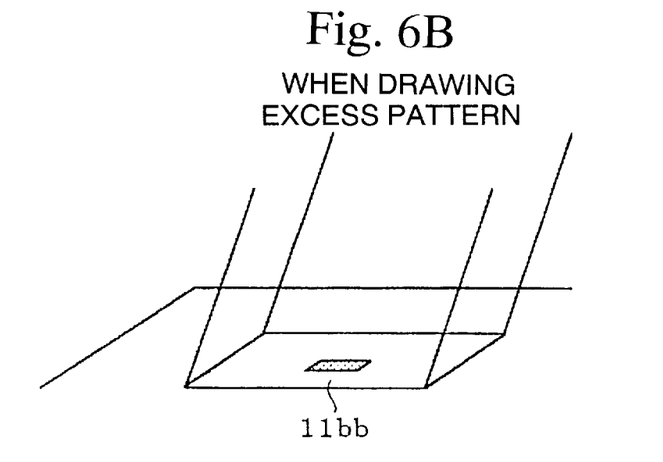

In the above method (2), as shown in FIG. 6A, the center portion pattern 11a is drawn using the cell projection exposure aperture 13b on the second mask $13_1$ (a blank shot area 1aa is then shown), and, as shown in FIG. 6B, the excess pattern 11b is drawn one after the other using the cell projection exposure aperture 13g which exposes the single pattern (a blank shot area 1bb is then shown). Furthermore, by combining the rectangular aperture 12a of the first mask $12_1$, and the rectangular 13a of the second mask $13_1$, a rectangular pattern is formed and patterns for the excess pattern 11b are exposed one after the other.

In the above method (3), as shown in FIG. 6A, the center portion pattern 11a is drawn using the cell projection exposure aperture 13b on the second mask $13_2$, and, as shown in FIG. 6B', the excess pattern 11b is drawn for each blank shot area 11bc using the cell projection exposure aperture 13h.

However, when the above method (1) is used, the size of a cell selected as the basic cell for the cell projection exposure is small, therefore, the number of partial blank shots increases and, as a result, the throughput decreases. When the above method (2) is used, since the excess pattern is exposed one after one, the number of partial blank shots also increases and the throughput decreases. When the above method (3) is used, since the throughput is improved, both the cell projection exposure aperture 13b for the center portion pattern and the cell projection exposure aperture 13h for the excess pattern have to be simultaneously prepared on the second mask (wherein a necessary type of cell projection exposure aperture for the excess pattern is not always one), therefore, the number of the cell projection exposure patterns which can be exposed on the second mask, is limited. Normally, the number of pattern types of the cell projection exposure aperture which can be provided on the second mask, is several to dozens.

Figure 7:
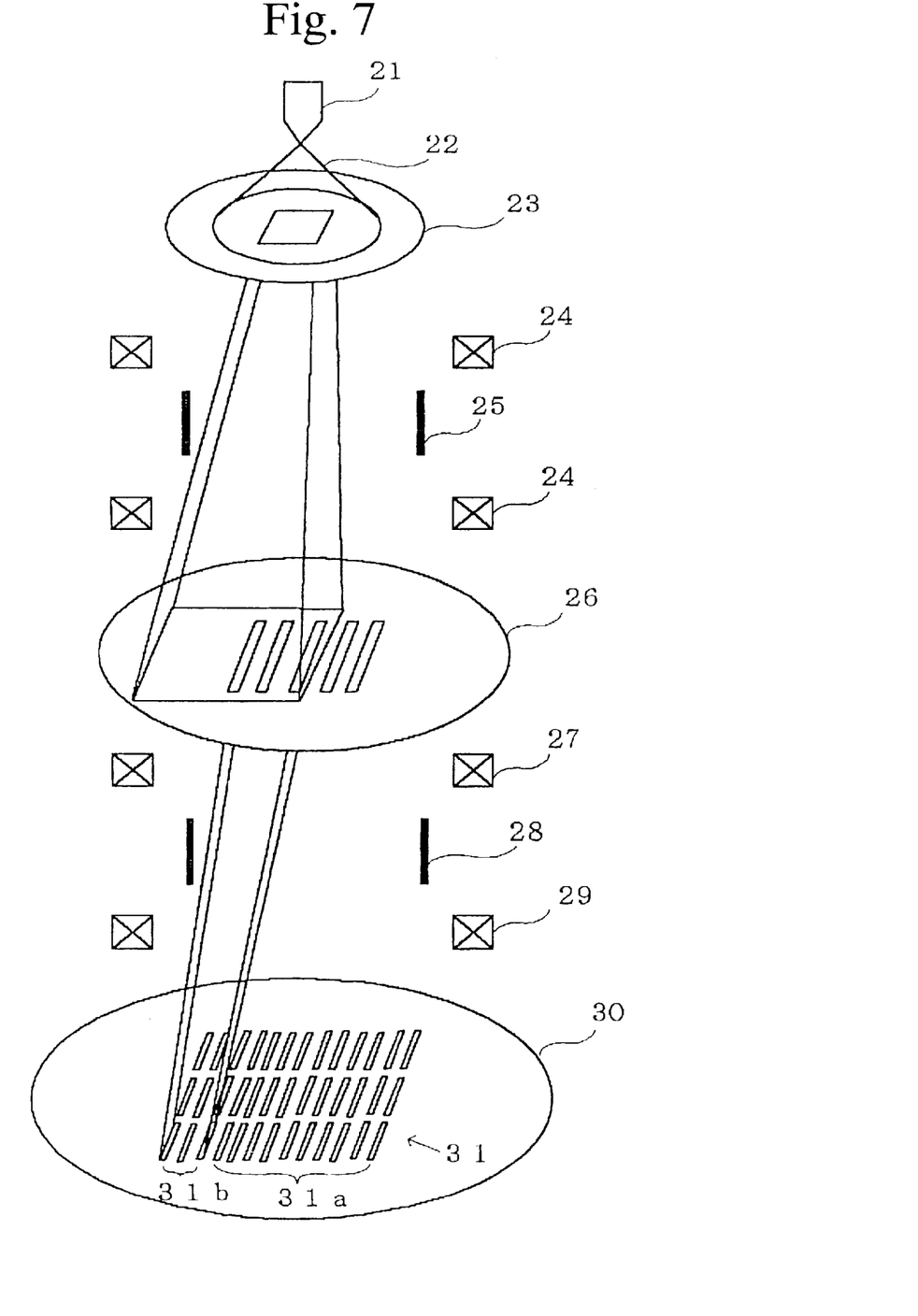
FIG. 7 is a schematic diagram illustrating an electron beam drawing apparatus according to an embodiment of another conventional art.

As a method to solve the above problems, a method in which an excess pattern is drawn by controlling deflection of the electron beam is disclosed in Japanese Unexamined Patent Application, First Publication, No. 7-211609 (Kokai) (which is hereafter called JP 7-211609). FIG. 7 is a schematic diagram showing an overview of the drawing apparatus disclosed in JP 7-211609. The apparatus is composed of an electron beam source 21, an electron beam 22, the first mask 23, a shaping lens 24, a shaping deflector 25, the second mask 26, a reducing lens 27, a locating deflector 28, an objective lens 29, and a semiconductor wafer 30. A cell array pattern 31 composed of the center portion pattern 31a and the excess pattern 31b is drawn on the semiconductor wafer 30.

When the center portion pattern 31a is drawn, the electron beam, after penetrating the first mask 23, is irradiated on all apertures to be exposed. When the excess pattern 31b is drawn, the electron beam, after penetrating the first mask 26, is deflected using the shaping deflector 25 and irradiated on a part of apertures on the second mask 26 to be exposed.

Similarly, the above drawing method is disclosed in Japanese Unexamined Patent Application, First Publication, No. Hei 6-13301 (Kokai).

According to the drawing method disclosed in JP 7-211609, the number of the cell projection exposure apertures which are provided on the second mask, can be decreased. On the other hand, the following problems arise.

The first problem is that it is difficult to place an end portion of the beam at a narrow space between the apertures on the second mask because deflection accuracy of the deflector is not always high. If the end portion of the beam is not placed at the narrow space, an overexposure or an incomplete pattern arises. Insufficient accuracy of the deflector is caused by not perpendicularly crossing the deflecting direction and the electron beam direction, or rotation of the electron beam.

The second problem is that the number of apertures which can be provided on the second mask is limited. Since the exposure of the excess pattern is executed by a positioning shift of the electron beam onto the second mask, not to irradiate to the adjacent aperture by the positioning shift of the electron beam, the interval between the cell projection exposure apertures which is provided on the second mask should be sufficiently wide. As a result, the number of the apertures to be provided on the second mask is limited.

The third problem is that an energy distribution profile is reduced toward the end portion of the irradiation area irradiated by the electron beam. When the electron beam is irradiated onto the mask, the center portion of the irradiation area irradiated by the electron beam is preferably used because the center portion has high energy strength, however, if the apparatus and the method shown in FIG. 7 are used, the end portion of the irradiation area irradiated by the electron beam is used prior to the center portion, so that there is a high possibility that the pattern shape will deteriorate.

BRIEF SUMMARY OF THE INVENTION

An object of the present invention is to obtain a charged particle beam drawing apparatus and a charged particle beam drawing method by which the drawing can be executed with high accuracy so that the number of the cell projection exposure apertures provided on the second mask does not increase and the total number of shots does not increase, by solving problems of the above-mentioned conventional arts.

To achieve the above object, the present invention provides a cell projection exposure-type charged particle beam drawing apparatus, in which a charged particle beam emitted by a charged particle beam source is irradiated for executing cell projection exposure onto a second mask comprising one or a plurality of cell projection exposure apertures through a first mask for exposing the pattern of the cell projection exposure apertures on a sample wafer, wherein the first mask comprises: a main aperture for exposing the whole area of the second mask for the cell projection exposure, and a supplementary aperture having a size of 1/N of the size of the main aperture, wherein N is an integer; and wherein the particle beam drawing apparatus is constituted such that the charged particle beam emitted by the charged beam source is irradiated on any one of the apertures formed on the first mask.

The present invention also provides a cell projection exposure-type charged particle beam drawing method in which a charged particle beam emitted by a charged particle beam source is irradiated for executing cell projection exposure onto a second mask comprising one or a plurality of cell projection exposure apertures through a first mask for exposing the pattern of the cell projection exposure apertures on a sample wafer, wherein the first mask comprises: a main aperture for exposing the whole area of the second mask for the cell projection exposure, and a supplementary aperture having a size of 1/N of the main aperture, wherein N is an integer; wherein most of a cell array pattern area on the sample wafer is exposed using a combination of the main aperture on the first mask and the cell projection exposure aperture on the second mask; and an excess cell array pattern area which occurs by exposing with the combination of the main aperture on the first mask and the cell projection exposure aperture on the second mask, is exposed using a combination of the supplementary aperture on the first mask and the partial exposure aperture on the second mask.

According to the above construction, the cell projection exposure aperture is 15 provided on the second mask and the main aperture through which the electron beam can be irradiated to the whole cell projection exposure aperture on the second mask and the supplementary aperture having a size of 1/N of the size of the main aperture are provided on the first mask, the center portion pattern of the cell array pattern is drawn by combining the cell projection exposure aperture and the main aperture, and further, the excess pattern of the cell array pattern is drawn by the cell projection exposure aperture. Therefore, the following effects are obtained:

(1) Since the size of the cell projection exposure aperture can be designed as big as possible within the size to be drawn using the drawing apparatus, the number of shots can be reduced.

(2) Since a part of the cell projection exposure aperture is chosen according to the supplementary aperture on the first mask, without depending on the deflector, the excess pattern can be drawn with high accuracy without depending on the deflection accuracy of the drawing apparatus.

(3) Since the positioning shift of the electron beam is not executed on the second mask, the interval between the adjacent apertures can be shortened and the number of the cell projection exposure apertures to be provided on the second mask can be increased.

(4) Since the center portion of the electron beam by which the masks are uniformly highly irradiated is preferably used instead of preferably using the end portion of the electron beam, the patterns can be satisfactorily formed without occurring a deterioration of the pattern shapes.

DETAILED DESCRIPTION OF THE INVENTION

Figure 1:
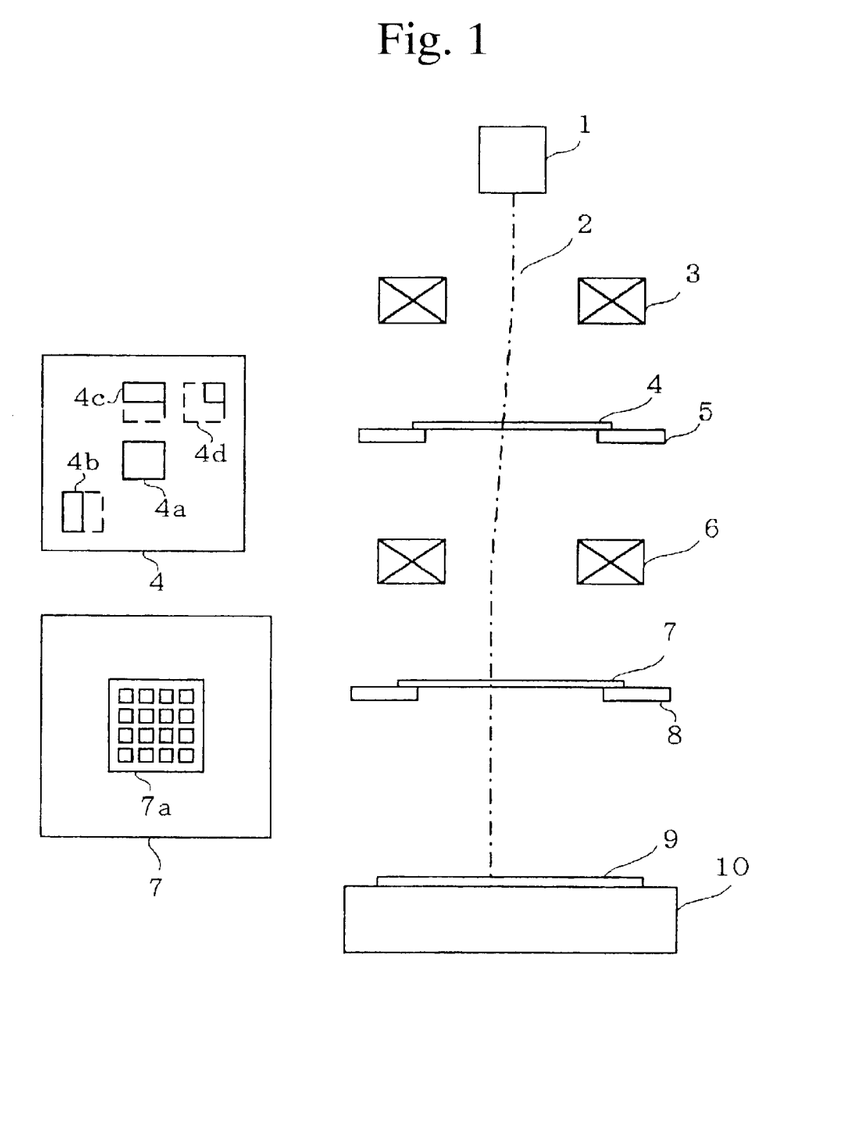
FIG. 1 is a schematic diagram illustrating an electron beam drawing apparatus according to an embodiment of the present invention.

An embodiment of the present invention is explained as follows. FIG. 1 is a schematic diagram showing an electron beam drawing apparatus according to the embodiment of the present invention. In the drawing apparatus shown in FIG. 1, in a second mask 7 provided on a second mask holding member 8, only a cell projection exposure aperture 7a by which the center portion pattern of the cell array pattern is drawn, and no cell projection exposure aperture for an excess pattern is formed. In the first mask 4 provided on a first mask holding member 5 is a main aperture to irradiate the whole area of the cell projection exposure aperture 7a onto the second mask 7 by the electron beam to penetrate to the first mask and an aperture to irradiate the excess pattern having an area of 1/N of the main aperture are provided, wherein N is an integer. In the embodiment shown in FIG. 1, a 1/2 aperture 4b having an area of 1/2 of the main aperture and a 1/4 aperture 4d having an area of 1/4 of the main aperture are formed on the first mask.

In the drawing apparatus shown in FIG. 1, an electron beam 2 emitted by an electron beam source 1, is deflected by a first pattern selection deflector 3 and irradiated onto the predetermined aperture on the first mask 4. The electron beam penetrating through the first mask 4 is deflected by a second pattern selection deflector 6, irradiated onto the second mask 7, and further irradiated onto a semiconductor wafer 9 provided on a wafer stage 10. As a result, a partial blank shot is executed.

When a cell array pattern of the center portion is drawn, the main aperture 4a of the first mask 4 is selected by the first pattern selection deflector 3 and the whole area of the cell projection exposure aperture 7a on the second mask 7 is irradiated by the electron beam. A pattern according to the pattern of the cell projection exposure aperture 7a is then drawn on the semiconductor wafer 9. When an excess pattern placed on the end portion of the cell array pattern is drawn, any one of the apertures 4b, 4c, and 4d on the first mask is selected by the first pattern selection deflector 3 and a partial area of the selected aperture of the cell projection exposure aperture 7a on the second mask 7 is irradiated. An area of 1/N of the cell projection exposure aperture is then drawn on the semiconductor wafer 9 provided on the wafer stage 10.

Whenever one shot exposure is executed, a position on the semiconductor wafer 9 to be irradiated by the electron beam is shifted by moving the wafer stage 10 to draw patterns with regard to the whole area of the cell array pattern.

One or plural supplementary apertures each having an aperture area of 1/N of the main aperture provided on the first mask are selected from the group of (1) a first supplementary aperture formed with a horizontal width which is equal to the horizontal width of the main aperture and a vertical width having a size of 1/N of the size of the vertical width of the main aperture, (2) a second supplementary aperture formed with a vertical width which is equal to the vertical width of the main aperture and a horizontal width having a size of 1/N of the size of the horizontal width of the main aperture, and (3) a third supplementary aperture formed with a horizontal width having a size of 1/N of the size of the horizontal width of the main aperture and a vertical width having a size of 1/N of the size of the vertical width of the main aperture.

The size of the cell projection exposure aperture 7a formed on the second mask is chosen so that the size is the maximum area or is as close as possible to the maximum area which is drawn with a cell projection exposure by the electron beam drawing apparatus.

The electron beam drawing apparatus is shown as an embodiment of the present invention in FIG. 1, additionally, the present invention is not limited to the above embodiment and can be applied to a drawing apparatus using an ion beam or the like.

EXAMPLES

Examples of the present invention are concretely explained with figures as follows.

Figure 2A:
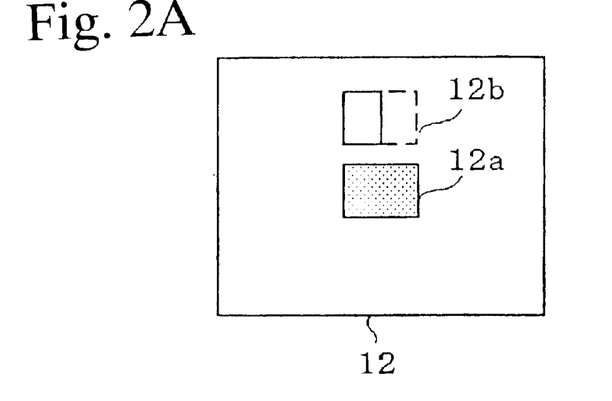
FIGS. 2A to 2C are pattern diagrams of the first and second masks and a cell array pattern diagram according to the first embodiment of the present invention.
Figure 2B:
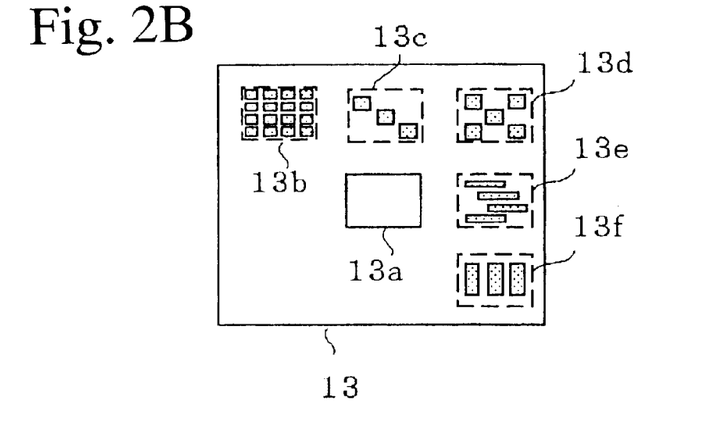
Figure 2C:
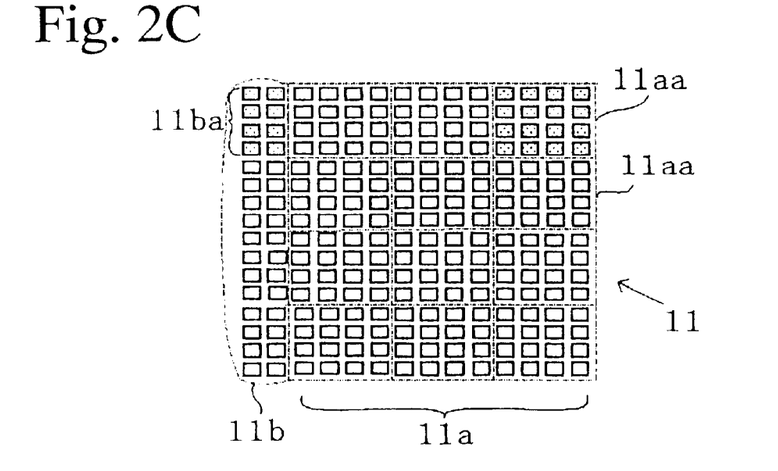

A lithography of a capacity contact which is a process in a DRAM manufacturing process, is explained as the first example of the present invention with FIGS. 2 and 3. As shown in FIG. 2C, a pattern of the contact is regularly arranged as a cell array pattern 11 by an array expansion of a cell. When the contact pattern is drawn by a partial blank direct drawing method, a particular repeating unit is selected from a design data for a single shot of a cell projection exposure, a cell projection exposure aperture per the repeat unit is formed, and the design data is converted and formatted to a data for a partial blank electron beam (which is hereinafter abbreviated "EB") direct drawing. According to the capacity contact of the DRAM shown in FIG. 2C, 16 contact holes are selected from the design data for the repeat unit for the cell projection exposure. To increase throughput, a standard of a size of the repeat unit to be selected is based on a maximum area comprising a pattern which can be drawn with a single shot. The pattern for the cell projection exposure to be selected by the above standard is drawn using a main aperture of the first mask and an aperture of the cell projection exposure aperture of the second mask, therefore, identification information of these apertures must be added when converted and formatted to the data for the partial blank EB direct drawing. However, if a cell projection exposure pattern is selected by the maximum area comprising the pattern which can be drawn with a single shot or an area which is as close as possible to the maximum area, an excess pattern which is not selected as a cell projection exposure pattern may occur at an end portion of a memory array. In the case of the example shown in FIG. 2, eight contact holes which are not included in the cell projection exposure pattern, are generated on the end portion of the memory array. The excess pattern is selected as a cell projection exposure pattern having a unit for eight contact holes, to be a pattern group having a size of 1/2 of the cell projection exposure pattern of the center portion of the memory array. The cell projection exposure pattern for the excess pattern selected according to the above is drawn using a supplementary aperture having an area of 1/2 of the main aperture of the first mask and the cell projection exposure aperture of the second mask, therefore, identification information of these apertures must be added when converted and formatted to the data for the partial blank EB direct drawing.

The first and second masks are prepared using the data for cell projection exposure obtained according to the above method. As shown in FIG. 2C, the cell array pattern 11 comprises a center portion pattern 11a to be drawn using the main aperture of the first mask and an excess pattern 11b to be drawn using the supplementary aperture of the first mask. On a first mask 12, as shown in FIG. 2A, a main aperture 12a is provided on the center portion and, simultaneously, a 1/2 supplementary aperture 12b is provided on the circumference portion. On a second mask 13, as shown in FIG. 2B, a cell projection exposure aperture 13b is provided to draw the cell array pattern 11 by the cell projection exposure. Furthermore, cell projection exposure apertures 13c, 13d, 13e, and 13f are also provided on the second mask 13 and, simultaneously, a rectangular aperture 13a is provided on the center portion. Drawing is executed according to the above aperture identification information of the data, as selecting the apertures of the first mask and the second mask.

Figure 3A:
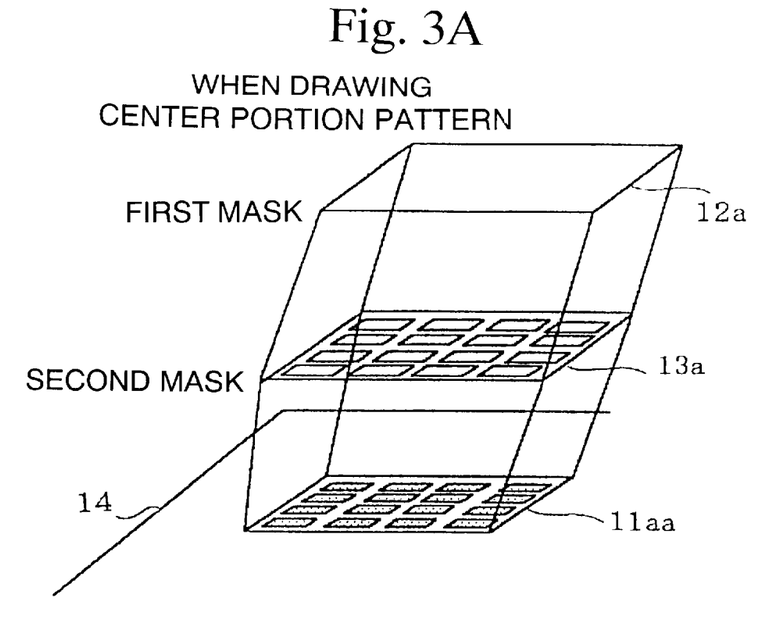
FIGS. 3A to 3B are schematic diagrams for explaining the state of the drawing according to the first embodiment of the present invention.
Figure 3B:
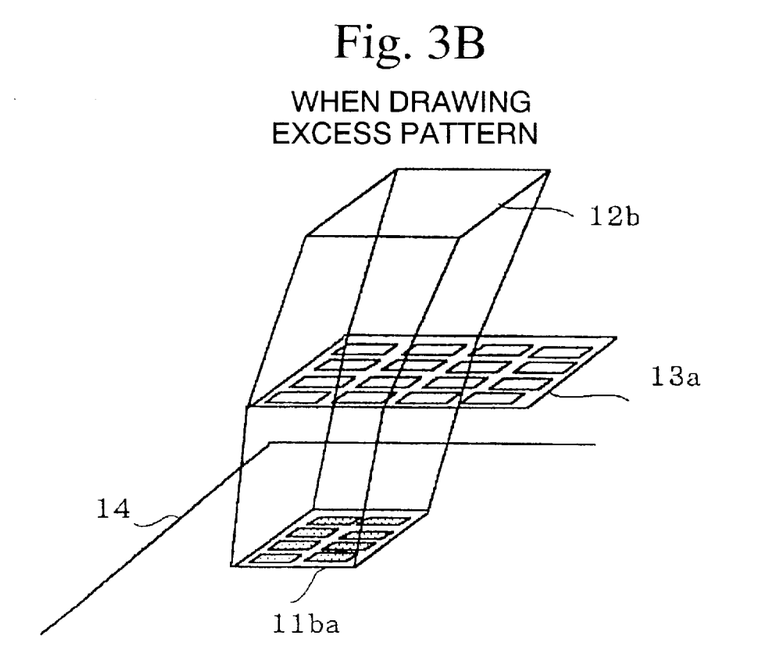

When the center portion pattern 11a of the cell array pattern 11 is drawn, as shown in FIG. 3A, a semiconductor wafer 14 is drawn using the main aperture 12a of the first mask 12 and the cell projection exposure aperture 13a of the second mask 13. A blank shot area 11aa is shown on the semiconductor wafer 14. Furthermore, when the excess pattern 11b of the cell array pattern 11 is drawn, as shown in FIG. 3B, the semiconductor wafer 14 is drawn using the 1/2 supplementary aperture 12b of the first mask 12 and the cell projection exposure aperture 13b of the second mask 13. A blank shot area 11ba is shown on the semiconductor wafer 14.

Figure 4A:
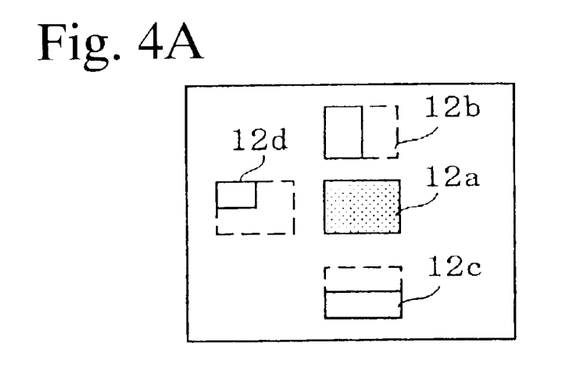
FIGS. 4A to 4C are pattern diagrams of the first and second masks and a cell array pattern diagram according to the second embodiment of the present invention.
Figure 4B:
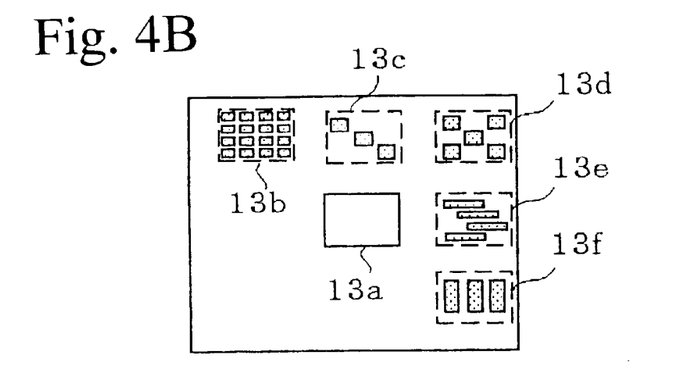
Figure 4C:
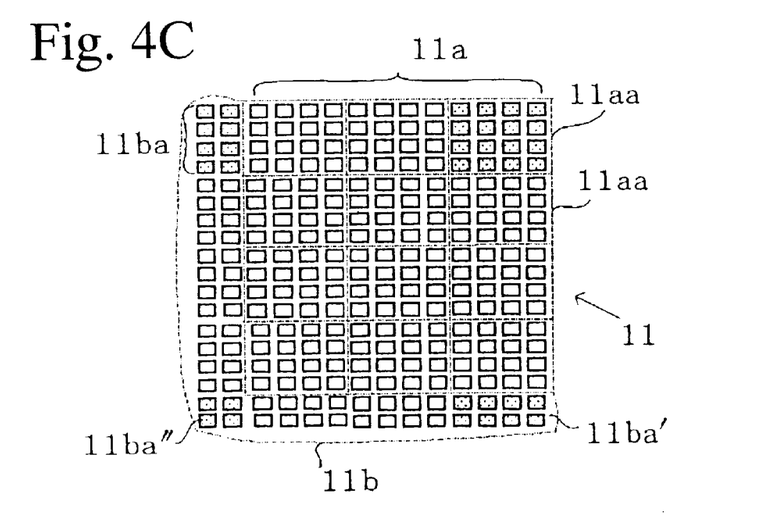

FIGS. 4A to 4C are pattern diagrams of the first and second masks and a cell array pattern diagram showing the second example of the present invention. This example, similarly, relates to the lithography of the capacity contact of DRAM. As shown in FIG. 4C, a pattern of the contact is regularly arranged as a cell array pattern 11 by an array expansion of a cell. When the contact pattern is drawn by a partial blank direct drawing method, a particular repeat unit is selected from design data for a single shot of a cell projection exposure, a cell projection exposure aperture per repeating unit is formed, and the design data is converted and formatted to data for a partial blank EB direct drawing. On the end portion of the cell array pattern 11, an excess pattern 11b including areas comprising eight contact holes and areas comprising four contact holes which are not included in the cell projection exposure pattern, are generated. The excess pattern is selected as the cell projection exposure pattern having a unit for area comprising eight contact holes or area comprising four contact holes. The cell projection exposure pattern for the excess pattern selected according to the above is drawn using two kinds of 1/2 aperture and a 1/4 aperture of the first mask, and the cell projection exposure aperture of the second mask, therefore, identification information of these apertures must be added when converted and formatted to the data for the partial blank EB direct drawing.

The first and second masks are prepared using the data for cell projection exposure obtained according to the above method. On the first mask 12, as shown in FIG. 4A, the main aperture 12a is provided on the center portion and, simultaneously, the 1/2 supplementary apertures 12b and 12c, and the 1/4 supplementary aperture 12d are provided on the circumference portion. On the second mask 13, as shown in FIG. 4B, the cell projection exposure aperture 13b is provided to draw the cell array pattern 11 by the cell projection exposure. Furthermore, as with the first example, cell projection exposures 13c, 13d, 13e, and 13f are also provided on the second mask 13 and, simultaneously, a rectangular aperture 13a is provided on the center portion. Drawing is executed according to the above aperture identification information of the data, along with selecting the apertures of the first mask and the second mask.

When the center portion 11a of the cell array pattern 11 is drawn, the semiconductor wafer is drawn using the main aperture 12a of the first mask 12 and the cell projection exposure aperture 13b of the second mask 13. A blank shot area 11aa is shown on the semiconductor wafer. Furthermore, when the excess pattern 11b of the cell array pattern 11 is drawn, first of all the semiconductor wafer is drawn using the 1/2 supplementary aperture 12b of the first mask 12 and the cell projection exposure aperture 13b of the second mask 13. A blank shot area 11ba is shown on the semiconductor wafer in FIG. 4C. Next, the semiconductor wafer is drawn using the 1/2 supplementary aperture 12c of the first mask 12 and the cell projection exposure aperture 13b of the second mask 13. A blank shot area 11ba' is shown on the semiconductor wafer. Further, the semiconductor wafer is drawn using the 1/4 supplementary aperture 12d of the first mask 12 and the cell projection exposure aperture 13b of the second mask 13. A blank shot area 11ba" is shown on the semiconductor wafer.

The excess pattern in the above examples is drawn using the supplementary aperture of the first mask and the cell projection exposure aperture of the second mask. Additionally, a part of the excess pattern may be drawn by forming a rectangular pattern using a combination of the main aperture of the first mask and the rectangular aperture of the center portion of the second mask and using a variable forming rectangular drawing method for the rectangular pattern.

What is claimed is:

1. A cell projection exposure charged particle beam drawing apparatus comprising:
    a charged particle beam source emitting a charged particle beam;
    a first mask having a main aperture and a supplementary aperture formed therein, said supplementary aperture having a size 1/Nth of the main aperture, wherein N is an integer;
    a second mask exposed to said charged particle beam through said first mask, said second mask having at least one cell projection exposure aperture formed therein,
    wherein said charged particle beam emitted by said charged particle beam source is irradiated onto any one of the apertures formed on said first mask for executing cell projection exposure onto the second mask so as to expose the pattern the cell projection exposure apertures on a sample wafer, and
    wherein the main aperture of the first mask exposes the whole area of the second mask for the cell projection exposure.

2. A cell projection exposure charged particle beam drawing apparatus according to claim 1, wherein the first mask comprises:

a first supplementary aperture formed with a horizontal width which is equal to the horizontal width of the main aperture and a vertical width having a size of 1/N of the size of a vertical width of the main aperture;

a second supplementary aperture formed with a vertical width which is equal to the vertical width of the main aperture and a horizontal width having a size of 1/N of the size of the horizontal width of the main aperture; and a third supplementary aperture formed with a horizontal width having a size of 1/N of the size of the horizontal width of the main aperture and a vertical width having a size of 1/N of the size of the vertical width of the main aperture.

3. A cell projection exposure charged particle beam drawing apparatus according to claim 1, wherein the first mask comprises either:

a first supplementary aperture formed with a horizontal width which is equal to the horizontal width of the main aperture and a vertical width having a size of 1/N of the size of the vertical width of the main aperture; or a second supplementary aperture formed with a vertical width which is equal to the vertical width of the main aperture and a horizontal width having a size of 1/N of the size of the horizontal width of the main aperture.

4. A cell projection exposure charged particle beam drawing apparatus according to claim 1, wherein a beam deflector is provided on the first mask to choose an aperture from the main aperture formed on the first mask and a plurality of the supplementary apertures.

5. A cell projection exposure charged particle beam drawing apparatus according to claim 1, wherein the size of the cell projection exposure aperture on the second mask is chosen so that the size is as close as possible to the maximum area which is drawn with a cell projection exposure by the cell projection exposure charged particle beam drawing apparatus.

6. A cell projection exposure charged particle beam drawing apparatus according to claim 1, wherein a rectangular aperture is formed on the second mask so that another rectangular aperture is formed by combining said rectangular aperture on the second mask with one of the apertures on the first mask and drawing is executed using a variable forming rectangular drawing method.

7. A cell projection exposure charged particle beam drawing method comprising the steps of:

using a charged particle beam source to emit a charged particle beam;

exposing a first mask to said charged particle beam, said first mask having a main aperture and a supplementary aperture formed therein, said supplementary aperture having a size 1/Nth of the main aperture, wherein N is an integer;

exposing a second mask to said charged particle beam through the main aperture of the first mask, said second mask having at least one cell projection exposure aperture formed therein;

using a combination of said main aperture of said first mask and said cell projection exposure aperture of said second mask to pattern the cell array pattern area on said sample wafer; and using a combination of said supplementary aperture on said first mask and a partial exposure aperture on said second mask to form an excess cell array pattern.

8. A cell projection exposure charged particle beam drawing method according to claim 7, wherein the partial exposure aperture and a rectangular aperture are formed on the second mask and a part of the excess cell array pattern area is drawn using the rectangular aperture on the second mask by the variable forming rectangular drawing method.

* * * * *